United States Patent [19]
Anderson et al.

[11] Patent Number: 6,023,384
[45] Date of Patent: *Feb. 8, 2000

[54] DATA RECORDING DEVICE AND CONTROL APPARATUS FOR RECORDING DATA TWICE ON ONE TRACK USING DIFFERENT ENCODING METHODS

[75] Inventors: Nathaniel Carl Anderson, Pine Island; Mohammed Amine Hajji, Cannon Falls; Hal Hjalmar Ottesen; Michael Joseph Ross, both of Rochester, all of Minn.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/450,513

[22] Filed: May 25, 1995

Related U.S. Application Data

[62] Division of application No. 07/979,110, Nov. 20, 1992, Pat. No. 5,422,761.

[51] Int. Cl.$^7$ .......................................................... G11B 5/09
[52] U.S. Cl. ................................. 360/48; 360/41; 360/47
[58] Field of Search ................................. 360/41, 46, 48, 360/47; 369/59

[56] References Cited

U.S. PATENT DOCUMENTS

| | | | |
|---|---|---|---|
| 2,680,239 | 6/1954 | Daniels et al. | 340/174 |
| 3,103,650 | 9/1963 | Gehring, Jr. et al. | 340/174.1 |
| 3,729,725 | 4/1973 | Denney et al | 340/174.1 |
| 3,883,891 | 5/1975 | Thompson et al. | 360/47 |
| 4,146,909 | 3/1979 | Beckenhauer et al. | 360/40 X |
| 4,270,154 | 5/1981 | Crawford | 360/98 |
| 4,484,176 | 11/1984 | Fitzpatrick | 360/40 X |
| 4,546,342 | 10/1985 | Weaver et al. | 360/32 |
| 4,703,371 | 10/1987 | Redmond et al. | 360/48 X |
| 4,772,963 | 9/1988 | Van Lahr et al. | 360/47 |
| 4,804,959 | 2/1989 | Makunsi et al. | 341/59 |

(List continued on next page.)

FOREIGN PATENT DOCUMENTS 54-79609   6/1979   Japan .

OTHER PUBLICATIONS

"Synchronized Dual Copy for Latency and RPS Miss Penalty Reduction", Jul. 1988 Document No. AAA88A062573, Research Disclosure n291 Jul. 1988.

Spencer W. Ng, "Improving Disk Performance via Latency Reduction", IEEE Transactions on Computers, vol. 40, No. 1, Jan. 1991, pp. 22–30.

R. Baird et al., "Synchronous Pair Block Recording", IBM Technical Disclosure Bulletin, vol. 25, No. 4, Sep. 1982, pp. 2053–2056.

(List continued on next page.)

Primary Examiner—W. C. Kim
Attorney, Agent, or Firm—Matthew J. Bussan

[57] ABSTRACT

A magnetic disk drive includes redundant data written at a plurality of out of phase angular locations to reduce the latency and enhance performance during a read operation. The loss of recording capacity is reduced by increasing the data density to achieve the same soft error rate standard required for single recording. Dual recording also allows different recording codes to be used at the duplicated locations to thereby have the more highly stressed code words occur at different locations in the data to further reduce the possibility of an error. The redundant recording can be used in one portion of the media and normal recording used in another media portion to enable selection of the recording technique in accordance with the type of data being stored. The size of the normal and redundant recording portions can be controlled by the format operation and the user of the disk drive can intervene to designate the size of the redundant and normal media recording portions effected during the format operation.

11 Claims, 3 Drawing Sheets

U.S. PATENT DOCUMENTS

| | | | |
|---|---|---|---|
| 4,814,903 | 3/1989 | Kulakowski et al. | 360/48 |
| 4,882,754 | 11/1989 | Weaver et al. | 381/35 |
| 4,986,668 | 1/1991 | Fukushima et al. | 360/49 |
| 5,031,218 | 7/1991 | Galand et al. | 360/32 X |
| 5,210,660 | 5/1993 | Hetzler | 360/51 |
| 5,257,143 | 10/1993 | Fangenhpour | 360/48 |
| 5,418,657 | 5/1995 | Machado et al. | 360/40 |
| 5,422,761 | 6/1995 | Anderson et al. | 360/47 |

OTHER PUBLICATIONS

S. Lee et al., Half Latency Format for Hard Disk Drive, IBM Technical Disclosure Bulletin, vol. 34, No. 7A, Dec. 1991, pp. 423–425.

E. Melen, "Write–Read Chaining", IBM Technical Disclosure Bulletin, vol. 15, No. 5, Oct. 1972 pp. 1560–1562.

P.A. Franaszek et al., "Providing Extra–Surfaces to Decrease Write Commit Times Disk Subsystems", IBM Technical Disclosure Bulletin, vol. 29, No. 10, Mar. 1987, pp. 4509–4511.

D. J. Winarski, Special Sector Size for Write–Once Disk Directories, IBM Technical Disclosure Bulletin, vol. 32, No. 9A, Feb. 1990, pp. 271–272.

S. W. Ng, "Latency Reduction for CD–Rom and CLV Disks", IBM Technical Disclosure Bulletin, vol. 34, No. 7B, Dec. 1991, pp. 19–20.

Y. Dishon, "Multiple Copy Disk Storage Device Using 180○ Synchronization Control", IBM Technical Disclosure Bulletin, vol. 32, No. 8B, Jan. 1990, pp. 180–182.

G. G. Floryance, "Using Dual Actuator Shared Data Direct Access Storage Devices Drives in a Redundant Array", IBM Technical Disclosure Bulletin, vol. 33, No. 8, Jan. 1991, pp. 270–272.

M. F. Bond et al., "Selecting Mirrored Disk Unit for Read Operations", IBM Technical Disclosure Bulletin, vol. 33, No. 4, Sep. 1990, pp. 33–34.

Patent Abstracts of Japan, No. 133, p–1436, Jun. 25, 1992, (JP–A–4–178975).

Patent Abstracts of Japan, No. 98, p–924, May 26, 1989, (JP–A–1–134760).

Patent Abstracts of Japan, No. 106, p–358, Jan. 12, 1985, (JP–A–60–5476).

Patent Abstracts of Japan, No. 49, p–1468, Aug. 31, 1992, (JP–A–4–243060).

Patent Abstracts of Japan, No. 148, p–49, Nov. 28, 1980, (JP–A–55–153183).

Patent Abstracts of Japan, No. 146, p–370, Feb. 28, 1985, (JP–A–60–38764).

English Translation of Japanese Patent Application No. 55–153183, Nov. 28, 1980.

English Translation of Japanese Patent Application No. 1–134760, May 26, 1989.

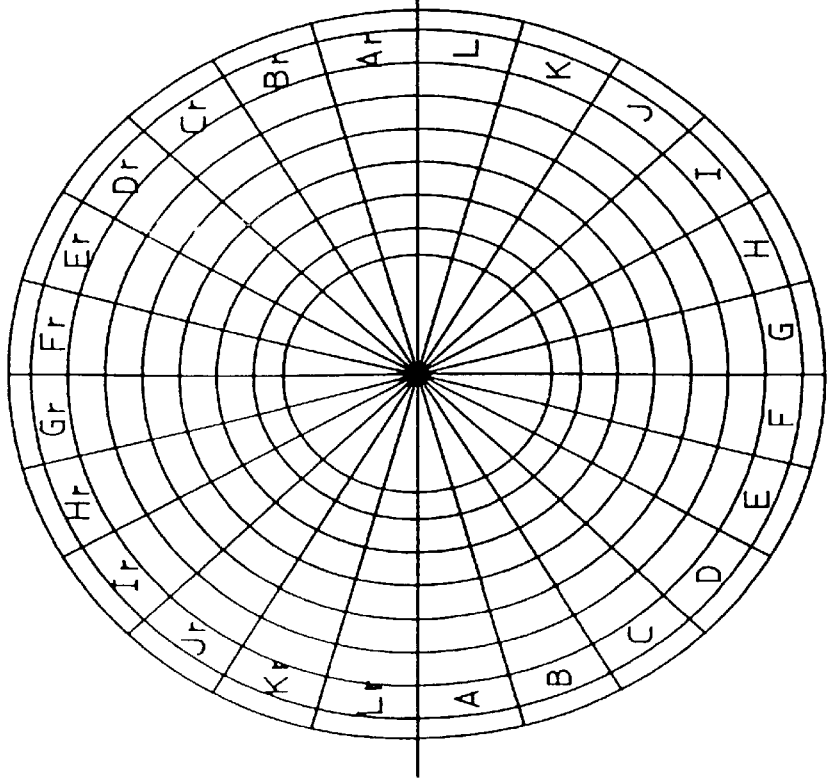

DATA RECORDING DEVICE AND CONTROL APPARATUS FOR RECORDING DATA TWICE ON ONE TRACK USING DIFFERENT ENCODING METHODS

This is a continuation of application Ser. No. 07/979,110, filed on Nov. 20, 1992 U.S. Pat. No. 5,422,761.

BACKGROUND OF THE INVENTION

The present invention relates to disk drive data storage devices. More particularly, the present invention is directed to a disk drive with reduced latency to optimize performance and data throughput.

As the speed and performance of data processing systems is increased it is necessary to enhance the performance of disk data storage devices that include mechanical as well as electronic functions. Critical aspects are the access time as the transducer moves from track to track and the latency as the rotating media revolves to the position of the data addressed on the track. The latency problem can be resolved by higher rotational velocities of the media, but this is limited by constraints such as recording channel bandwidth, power consumption and spindle bearing life. These factors are particularly critical in smaller form factor devices wherein smaller media must rotate at a higher velocity to obtain the same linear velocities obtained using a larger diameter media and in portable devices where the size of the portable power supply is a criteria.

In various prior art devices the latency problem is addressed by redundant recording on the same or different tracks, the use of multiple transducer heads or most usually, a combination of multiple heads and redundant recording. U.S. Pat. No. 2,680,239 teaches the use of multiple transducer heads which address the same track. A switching device activates the head nearest the data of interest. In U.S. Pat. No. 3,103,650 multiple heads are used and in one embodiment four heads are used in conjunction with triplicate recording to read data stored on a track in one-twelfth of a revolution. U.S. Pat. No. 3,729,725 includes two transducer heads that write in separate regions (different tracks) with the data written by the second transducer head delayed by 180 degrees of rotation to assure that the beginning of the redundant data is displaced 180 degrees. A dual actuator system is used in U.S. Pat. No. 4,270,154 wherein the actuators are positioned 180 degrees apart around the disk periphery so that any read or write operation is done by the actuator that can first commence the operation.

SUMMARY OF THE INVENTION

In the device of the present invention only a single transducer is utilized to address each track. The data is redundantly recorded on each track with the duplicate recordings angularly separated by 360 degrees divided by the number of redundant recordings. The most practical embodiment is the dual recording of data written at locations 180 degrees apart. This reduces the latency associated with a read operation by half, but actually increases the duration of the write operation because of the duplicate recording.

Although it would appear that the recording capacity of the device would be reduced by half as a result of the dual recording of data, such is not the result. Since the data is recorded twice, a higher soft error rate (SER) can be accepted in each of the redundant fields while achieving an overall soft error rate that is acceptable. For example, dual recording enables a recording density 36% greater while maintaining the SER of the single recording technique. Thus the reduction of storage capacity is 32% rather than 50% with respect to this aspect alone. In addition, the duplicate recording enables other storage capacity improvements. For example, with most devices utilizing run length limited (RLL) codes for recording data, different RLL codes can be used for initial recording and duplicate recording of the data. By selecting RLL codes with different code words that are most highly stressed, the likelihood of errors in the same portion of the duplicated data is reduced which also permits increased recording density with the same SER.

In addition, the user can choose to operate the drive in single mode at full capacity, redundant mode at reduced capacity, or in a combination mode with some single and some redundant modes within the same drive. This definition is determined when the user prepares the drive during the formatting process and can be changed by reformatting the drive to another configuration.

BRIEF DESCRIPTION OF THE DRAWING

FIG. 1 is a schematic showing of a disk drive media surface wherein a track has been redundantly recorded 180 degrees out of phase. FIG. 2 shows a single sector of a data track.

DETAILED DESCRIPTION

Figure 3:
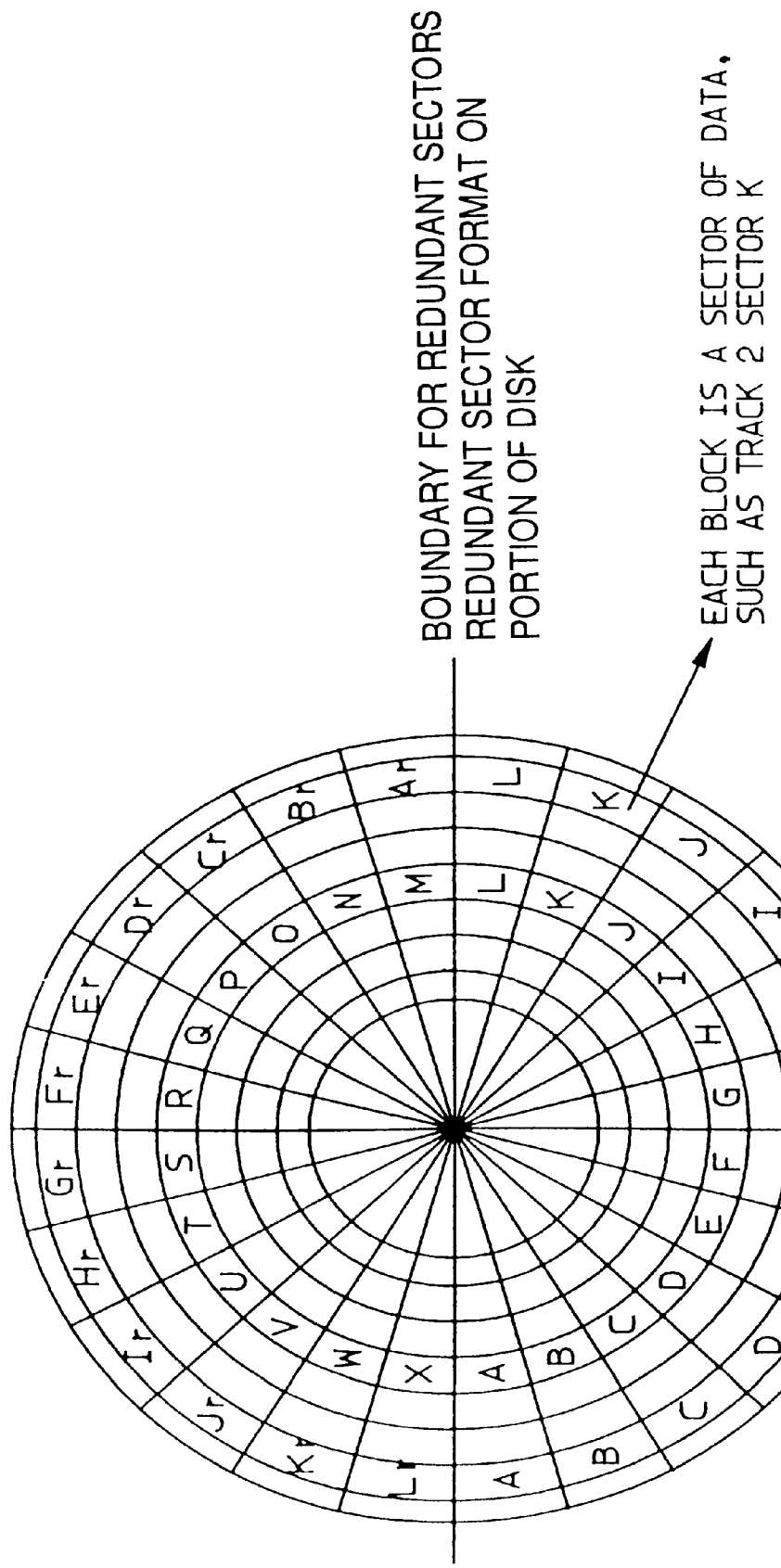
FIG. 3 is a showing similar to FIG. 1 wherein a mixed format of redundant and normal recording is used.

The disk drive industry trend is for specific user applications to require ever increasing performance, which is satisfied by increasing spindle rotational velocities and reducing access times. The need for improved access speed and data rate performance places demands on specific form factor constraints such as the spindle and actuator mass, power consumption and bearing life. At a given form factor, the cost of improving these performance numbers by a significant percentage is substantial. This invention is directed to solving the problem of reducing latency in disk storage devices without increasing the rotational speed of the device and with minimal impact on the storage capacity and error rate performance.

Although the data could be replicated any number of times at angularly displaced locations, the invention is illustrated by writing data twice on the same track at locations 180 degrees apart. Using this format, the latency or average time for a head on the track to reach desired data on that track is reduced by exactly 50%. It is recognized that this format only enhances performance for the read operation, while the write operation requiring that the data be written twice will actually result in a longer delay. During the read operation, with track split in halves of redundant data, the mean latency for the first occurrence of the desired data is 0.25 of the time for one revolution. Ordinary latency without the use of redundant data is 0.5 the time for one revolution of the spindle. For the write operation with two redundant track halves, the average latency is 0.75 of the time for one revolution. Thus the performance depends on the read to write ratio. In an environment where four reads per write occur, the use of two redundant zones would reduce latency by 30%. While a one to one ratio would result in no saving, a nine to one ratio would achieve a 40% saving.

A limitation to the use of redundant data is the time delay caused by a head switch that occurs more often since it is necessary to switch heads every half revolution rather than following a full revolution. This limitation results in a reduced saving as the size of the data block being transferred increases.

To the first order, the above concept involves a 50% loss in capacity using the conventional mindset about a design point. However, given that data is written twice on the disk, it is possible to use a smaller track pitch, higher linear density or both to offset this loss of capacity. This can reduce the loss of storage capacity at the same error rate.

Assume that the magnetic design is optimized in the classical sense with a track density and a linear density for a given acceptable error rate performance. This represents the capacity that can be achieved using the conventional approach and is therefore the benchmark for the subsequent comparison.

In simple terms, the capacity loss occasioned by double recording of the data can be completely recovered if it is possible to double either the track density or the linear density. A more likely option is a suitable combination of increases in both densities. An accurate estimate of what can be achieved in terms of capacity at the same error rate performance would require the convolution of the bathtub curve (soft error rate versus head off-track curve) associated with a doubling of data on a track with the track misregistration (TMR) distribution. From a test viewpoint, the data would have to be written twice on a track and a suitable algorithm developed to handle the second attempt at reading data after an error is encountered. With these features in place, the optimization of linear density and track pitch would proceed in the same manner as in the classical approach. Errors would be registered only if they occur on both attempts to read the same data in one revolution. Curves would be generated based on higher linear and track density designs until the benchmark curve is approximated. Under this condition the SER will closely match that of the benchmark.

In the absence of the above test data, it is possible to sense the ability to achieve higher areal densities to offset the duplication of data by the following argument. Suppose that for a given linear density the SER achieved is some number, say $10^{-10}$. If the data on the track is repeated once while maintaining the linear density fixed, then the SER theoretically possible is the probability of having the error twice. From probability theory, this is the product of the original error rate with itself or $10^{-20}$. Hence lost capacity due to duplication can be recouped by increasing the linear density until the SER degrades back to $10^{-10}$.

This concept is readily accomplished using existing hardware with appropriate modifications to the microcode. For most applications the string of information to be recorded is typically small in length so the double write operation will be completed with essentially no overhead. For longer strings, a write cache would buffer the data until the drive can resume doubling the data.

Even if the recovery of capacity lost as a result of duplication is not 100%, there are many applications where throughput far outweighs capacity. In that case this invention offers a strategic solution. From a power and spindle speed viewpoint, it is becoming more and more difficult to make significant advances that translate into improved data throughput performance. In some applications, the power required for high rotational velocities is prohibitive. Moreover as spindle bearings are being designed to run faster and fit into smaller form factors, bearing life is found to drop rapidly with rotational speed. Hence, this invention provides a relatively simple solution to lowering latency when hardware and power considerations are reaching apparent technical barriers.

Also, in many specific applications the standard requirements for extremely low SER are not necessary. In particular, applications such as multimedia, animated graphics, etc, where the output is pictures on a screen, the SER could be orders of magnitude higher since the eye is forgiving at that scale. Hence it is possible to be much more aggressive regarding linear density (and optimize the design point write to channel capability and RPM) so latency is improved without impacting capacity.

FIG. 1 is a schematic representation of a recording media disk surface that has been written using 100% redundancy including sectors A through L recorded on one half of a track and duplicated by sectors Ar through Lr written on the other half of the track with the redundant sectors separated by a 180 degree phase shift. As shown in FIG. 2, each sector has a header portion which includes identification of the media surface, track number, sector number, format and coding information and a data portion in which the user data to be stored is written.

FIG. 3 is a schematic showing of a disk data surface incorporating a mixed format including tracks with the 100% redundant format wherein data stored in sectors A through L is duplicated in sectors Ar through Lr on the other half of the track. Other tracks include a normal format where sectors A through X occupy the entire track. Thus the drive may be used totally in the normal mode or totally in the redundant mode or one portion or zone can be formatted for redundant recording while another zone is formatted for normal recording as in FIG. 3. The trade off option between the high capacity of normal recording and the high performance of redundant recording may be chosen by the user. This ability provides a drive which can be customized to the user's needs and can be changed to accommodate changing requirements.

Figure 4:
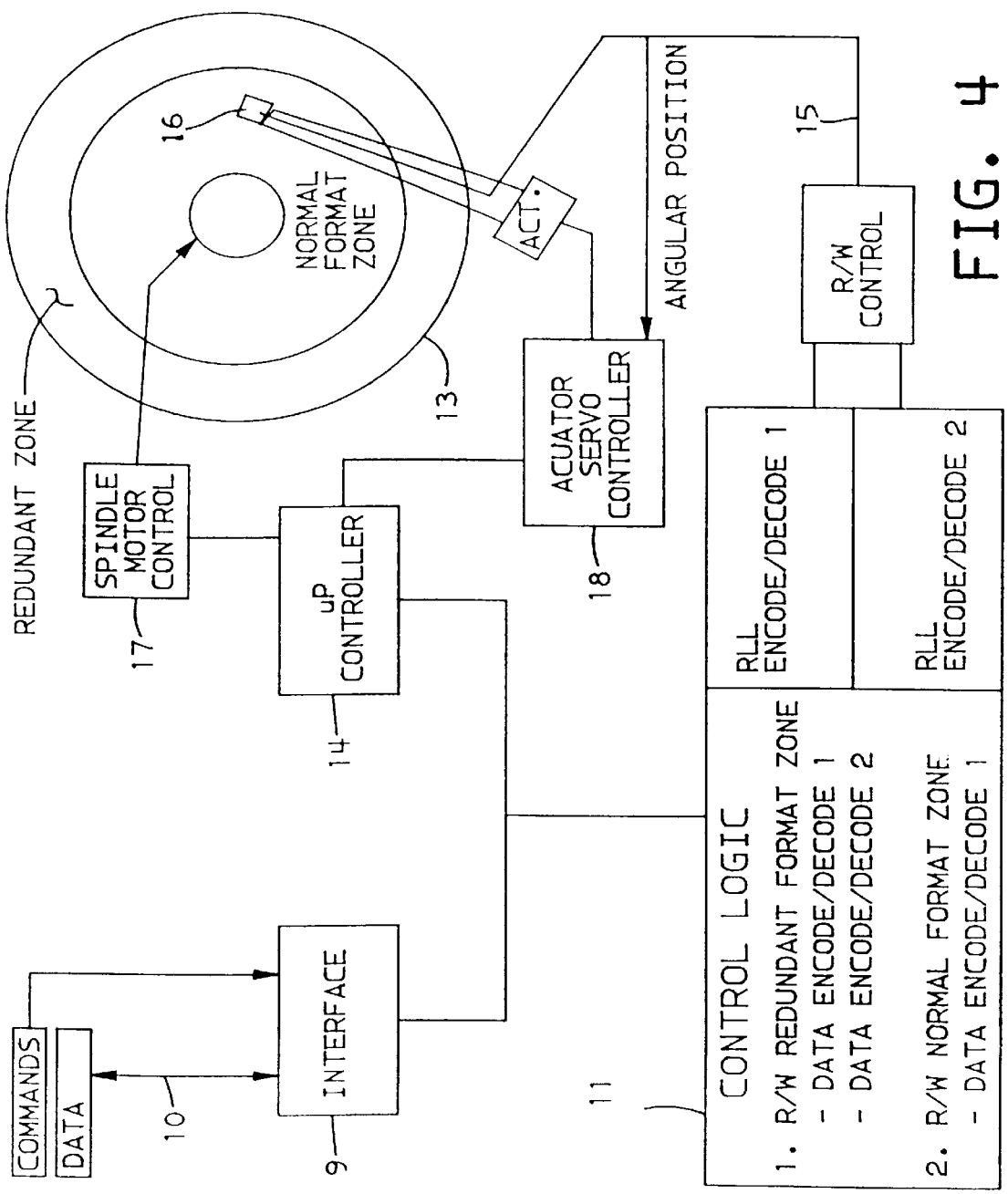
FIG. 4 is a block diagram of a disk drive control system including the redundant recording technique of the present invention.

The block diagram of FIG. 4 includes a microprocessor controller 14 which exercises overall control of the disk drive including spindle motor control logic 17 to regulate the rotational speed of disk stack 13 and actuator servo control logic 18 which positions the transducer in alignment with a selected media track and maintains track alignment. The angular position is sensed from the signal from the servo head in drives where a dedicated servo surface is used or from the individual surface servo information within the sector header in drives which use an embedded or sector servo system. Data to be written is received at interface 9 from a host system on data bus 10 and processed by channel control logic 11 which senses the type of data and sets the parameters as to single or dual recording and the recording density to optimize the overall recording density and performance in accordance with the error tolerance of the type of data being recorded. For dual recording, the recording code (encode/decode 1 or 2) is selected in accordance with the angular position of the disk stack and encoded serial data is received by the channel 15 for transmission to the transducer head 16 for recording on a media track on disk stack 13. If the single recording mode is to be used, the recording code is selected. With the availability of dual encoding methods, the default code for a single recording format can be selected at the time of manufacture to be the code which is most effective for each transducer-media surface combination. Thus it is possible to further accommodate media and head variables such as heads which are narrower or wider within the manufacturing tolerance.

When reading data stored on the media of disk stack 13, the serial data received on channel is decoded using the code indicated by the angular position, data type and selected default code in the environment of single recording.

In direct access storage devices such as rigid magnetic disk drives, it has been found that a 6% increase in the linear recording density results in a corresponding order of magnitude (factor of 10) increase in the soft error rate (SER). Thus if the soft error rate standard is $10^{-12}$ and 100% redundancy is used, the error rate in each of the recorded areas can be $10^{-6}$ to maintain an overall SER of $10^{-12}$. The error rate of $10^{-6}$ is six orders of magnitude less than the $10^{-12}$ standard allowing for a six times 6% or 36% increase in the linear recording density while maintaining the same overall error rate.

For a typical disk drive rotating at 4500 RPM (6.66 milliseconds latency) with a capacity of 1.2 GB assuming an on track error rate of $10^{-12}$, 100% redundancy would result in a disk drive with 816 MB capacity with a latency of 3.33 milliseconds while maintaining the same error rate standard. Thus the user must sacrifice some capacity, but not 50%, to cut the latency time in half. If zone bit recording (ZBR) was used in this case with a capacity gain of 25%, the storage capacity of such a drive would be over 1 GB. The alternative would be to spin the spindle at 9000 RPM increasing the spindle power consumption by a factor of 4 and reducing the bearing life.

What is claimed is:

1. A data recording and reproducing device wherein data is recorded in parallel tracks divided into sectors that repetitively pass a transducing location, each of the sectors having a header portion followed by a data portion, the header portion containing servo information and the data portion containing user data, comprising a recording media;

transducing means positionable to write data on and read data from said media; and means for recording user data in the data portion of one of the sectors on one of the tracks a first time using a first encoding method and for recording the same said user data in the data portion of another of the sectors on said one of the tracks a second time using a second encoding method, said second encoding method being different from said first encoding method.

2. The data recording and reproducing device of claim 1 wherein said first and second encoding methods are differing run length limited codes.

3. The data recording and reproducing device of claim 2 wherein said first and second recordings of said user data are 180 degrees out of phase on said track.

4. The data recording and reproducing device of claim 1 wherein said means for recording records said user data at an initial recording location on said track said first time and at a redundant recording location on said track said second time, the recording device further comprising means for reading said user data at said initial recording location on said track using a first decoding method and at said redundant recording location on said track using a second decoding method, said second decoding method being different from said first decoding method.

5. The data recording and reproducing device of claim 4 wherein said means for reading selects either said first decoding method or said second decoding method based on the angular position of the recording media.

6. The data recording and reproducing device of claim 1 wherein said means for recording selects either said first encoding method or said second encoding method based on the angular position of the recording media.

7. A control apparatus for a data recording and reproducing device wherein data is recorded in parallel tracks divided into sectors on a recording media that repetitively pass a transducing location, each of the sectors having a header portion followed by a data portion, the header portion containing servo information and the data portion containing user data, said control apparatus comprising:

means for positioning a data transducer to write data on and read data from said media; and means for recording user data in the data portion of one of the sectors on one of the tracks a first time using a first encoding method and for recording the same said user data in the data portion of another of the sectors on said one of the tracks a second time using a second encoding method, said second encoding method being different from said first encoding method.

8. The control apparatus for a data recording and reproducing device of claim 7 wherein said first and second encoding methods are differing run length limited codes.

9. The control apparatus for a data recording and reproducing device of claim 7 wherein said means for recording records said user data at an initial recording location on said track said first time and at a redundant recording location on said track said second time, the recording device further comprising means for reading said user data at said initial recording location on said track using a first decoding method and at said redundant recording location on said track using a second decoding method, said second decoding method being different from said first decoding method.

10. The control apparatus for a data recording and reproducing device of claim 9 wherein said means for reading selects either said first decoding method or said second decoding method based on the angular position of the recording media.

11. The control apparatus for a data recording and reproducing device of claim 7 wherein said means for recording selects either said first encoding method or said second encoding method based on the angular position of the recording media.

* * * * *